United States Patent [19]

Loualiche et al.

[11] Patent Number: 5,256,968

[45] Date of Patent: Oct. 26, 1993

[54] MEASUREMENT OF HIGH-FREQUENCY ELECTRICAL SIGNALS BY ELECTRO-OPTICAL EFFECT

[75] Inventors: Slimane Loualiche; Fabrice Clerot, both of Lannion, France

[73] Assignee: France Telecom, Paris, France

[21] Appl. No.: 922,207

[22] Filed: Jul. 30, 1992

[30] Foreign Application Priority Data

Aug. 9, 1991 [FR] France ................. 91 10164

[51] Int. Cl.$^5$ .................................. G01R 23/16
[52] U.S. Cl. ........................ 324/96; 324/76.36
[58] Field of Search ............. 324/96, 158 R, 158 D, 324/77 K, 117 R, 76.36; 356/364, 368, 365, 400, 401

[56] References Cited

U.S. PATENT DOCUMENTS

| | | |
|---|---|---|
| 4,446,425 | 5/1984 | Valdmanis et al. ............. 324/77 K |
| 4,618,819 | 10/1986 | Mourou ........................ 324/96 |
| 4,891,580 | 1/1990 | Valdmanis ................... 324/77 K |
| 5,041,778 | 8/1991 | Loualiche et al. ............ 324/76.36 |

FOREIGN PATENT DOCUMENTS 8302829 8/1983 PCT Int'l Appl. .

OTHER PUBLICATIONS

"40 GHz Measurement of InP/Air Gap Line by Picosecond Electro-optic Sampling", Electronic Letters, by S. Loualiche, F. Clerot and G. Audibert, Feb. 15, 1990, vol. 24, No. 4 pp. 266–267.

*Introduction to Optical Electronics*, by Amnon Yariv, Holt, Rinehart and Winston, 1976, pp. 427–430.

Primary Examiner—Vinh Nguyen
Attorney, Agent, or Firm—Laubscher & Laubscher

[57] ABSTRACT

A system for measuring an electrical signal in a frequency range substantially equal to the bandwidth the signal close to the gigahertz includes two laser sources. A first laser source emits a first light wave which is polarized, then amplitude-modulated by the electrical signal through an electro-optic medium. A second laser source emits a second light wave which is polarized, and then is combined with the amplitude-modulated wave to produce a measurement wave characterizing the phase and frequency of the electrical signal to be measured. The beat between the frequencies of the two polarized waves is checked thereby transposing the measurement wave into the frequency range.

9 Claims, 4 Drawing Sheets

MEASUREMENT OF HIGH-FREQUENCY ELECTRICAL SIGNALS BY ELECTRO-OPTICAL EFFECT

BACKGROUND OF THE INVENTION

1 Field of the Invention

This invention relates in general to the measurement of high-frequency electrical signals with a wide frequency band by electro-optical effect.

With the advent of photodetectors, photoconductive switches and other ultrafast electrical devices, the need arose for a measurement system capable of characterizing electrical signals with a resolution in the region of one picosecond.

2 Description of the Prior Art

In the past, such measurements were carried out by means of sampling oscilloscopes of resolution limited to approximately 25 picoseconds. Since then, the utilization of the electro-optical effect has introduced considerable developments in the characterization of an electric signal with resolutions in the region of one picosecond by a sampling technique. This new electro-optical technique for sampling an electric signal, e.g. by means of a Pockels cell lighted by ultra-short laser pulses, has been continually improved but has numerous drawbacks nonetheless.

Measurement systems based on time sampling require a very cumbersome (1.50 m) and costly short-pulse laser source. Moreover, to measure electric signals by a stroboscopic method as described in the article "40 GHz measurement on InP/air gap line by picosecond electro-optic sampling", by S. Loualiche, F. Clerot and G. Audibert, published in the ELECTRONICS LETTERS, Vol. 24, No. 4, p. 266-267, Feb. 15, 1990, the laser source used must be active mode-locked and the pulses generated then often have a period in excess of 30 picoseconds. It is then necessary to use a pulse compressor to effectively obtain pulse periods in the region of one picosecond. These systems are, however, difficult to adjust and introduce additional noise problems.

Furthermore, optical pulse sampling of an electrical signal by means of a stroboscopic method consisting of sampling the entire profile of said electrical signal requires a fluctuation of the width of the laser pulse (jitter) in the region of one picosecond. This, however, is not usually the case in mode-locked laser sources in which the light pulse width is in the region of 5 picoseconds. For measurement purposes, this jitter makes it necessary to use a phase stabilization loop which increases the complexity of the system and makes it more difficult (adjustment) and costly to use.

OBJECT OF THE INVENTION

The main object of this invention is to remedy the preceding disadvantages, particularly to facilitate the measurement of high-frequency electrical signals with a large bandwidth in the frequency range, again using the electro-optical effect.

SUMMARY OF THE INVENTION

Accordingly, a method for measuring an electrical signal with a large frequency bandwith comprises the following steps:

emitting a first rectilinearly-polarized monochromatic light wave having a first frequency, amplitude-modulating the first light wave by the electrical signal into an amplitude-modulated light wave having two frequency sidebands representative of the bandwidth of the electrical signal to be measured, filtering light frequency components of the amplitude-modulated light wave, emitting a second monochromatic light wave having a second frequency substantially different from the first frequency and rectilinearly-polarized parallel to the first light wave, combining first and second light waves into a checking wave having a beating frequency equal to the difference between the first and second frequencies, checking the beating frequency in the checking wave in order that, by adjustment of one of the first and second frequencies, the one of the first and second frequencies be substantially in the region of one of the two frequency sidebands in relation to the amplitude-modulated light wave, combining the frequency light components of the amplitude-modulated wave and the second light wave into a measurement light wave, and detecting the measurement light wave in a frequency range substantially equal to the bandwidth of the electrical signal.

The second polarized wave is used for coherent demodulation of the amplitude-modulated wave, in order for the frequency band of the measurement wave to be included in a frequency range below the carrier frequency or midband frequency of the electric signal to be measured. The combining of the frequency components of the amplitude-modulated wave and the second polarized wave is equivalent to a frequency transposition. The frequency band of the electrical signal thus transposed can therefore be more efficiently processed and displayed, subsequent to the detection of the measurement wave. To obtain the frequency transposition, the emitting of the one of the first and second monochromatic light waves is implemented by a laser source having adjustable emission frequency in order for the frequency difference between the two monochromatic waves checked in the measurement wave to be as near as possible to the frequencies of the electrical signal. Under these conditions, measurement of the phase and frequency characteristics of the electrical signal is conducted in a frequency range well below the real frequency band of the signal.

According to the invention, a system for measuring a signal with a frequency bandwith, comprises:

first emitting means for emitting a first monochromatic light wave having a first frequency, first polarizing means for rectilinearly-polarizing the first light wave successively into first and second rectilinearly-polarized light wave having different polarizations therebetween, means for amplitude-modulating the second polarized light wave by the electrical signal into an amplitude-modulated light wave, frequency tunable means for filtering the amplitude-modulated light wave into different frequency light components lying within the frequency bandwidth of the electrical signal, second emitting means for emitting a second monochromatic light wave having a second frequency substantially different from the first frequency, second polarizing means for rectilinearly polarizing the second monochromatic wave successively into third and fourth rectilinearly-polarized light waves having polarizations different therebetween and respectively parallel to the polarizations of the first and second polarized light waves.

first combining means for combining the first and third polarized light waves into a checking light wave, when the first and second polarizing means polarize simultaneously the first and second light waves into the first and third polarized light waves means for analyzing the checking light wave thereby deriving a difference between the first and second frequencies of said first and second monochromatic light waves, second combining means for combining the frequency light components and the fourth polarized wave into a measurement light wave, when the first and second polarizing means polarize simultaneously the first and second light waves into the second and fourth polarized light waves, and means for detecting the measurement light wave thereby analyzing phase and frequency characteristics of the electrical signal in a frequency range substantially equal to the bandwidth of the electrical signal.

Preferably, the first polarizing means comprises a first axially-rotatable half-wave plate and a first polarizer successively disposed along a propagation axis of the first light wave between the first emitting means and both the first combining means and amplitude-modulating means, and the second polarizing means comprises a second axially-rotatable half-wave plate and a second polarizer successively disposed along a propagation axis of the second light wave between the second emitting means and both the first and second combining means. During a polarized wave frequency checking, the first and second half-wave plates are rotated to a first position thereby simultaneously transmitting the first and third polarized light waves through the first and second polarizers to said first combining means respectively.

Then during a frequency spectrum measurement, the first and second plates are rotated to a second position thereby simultaneously transmitting the second and fourth polarized light waves through the first and second polarizers to the amplitude-modulating means and the second combining means respectively.

BRIEF DESCRIPTION OF THE DRAWINGS

The foregoing and other objets, features and advantages of the invention will be apparent from the following detailed description of several preferred embodiments of this invention with reference to the corresponding accompanying drawings in which.

DESCRIPTION OF THE PREFERRED EMBODIMENTS

Figure 1:
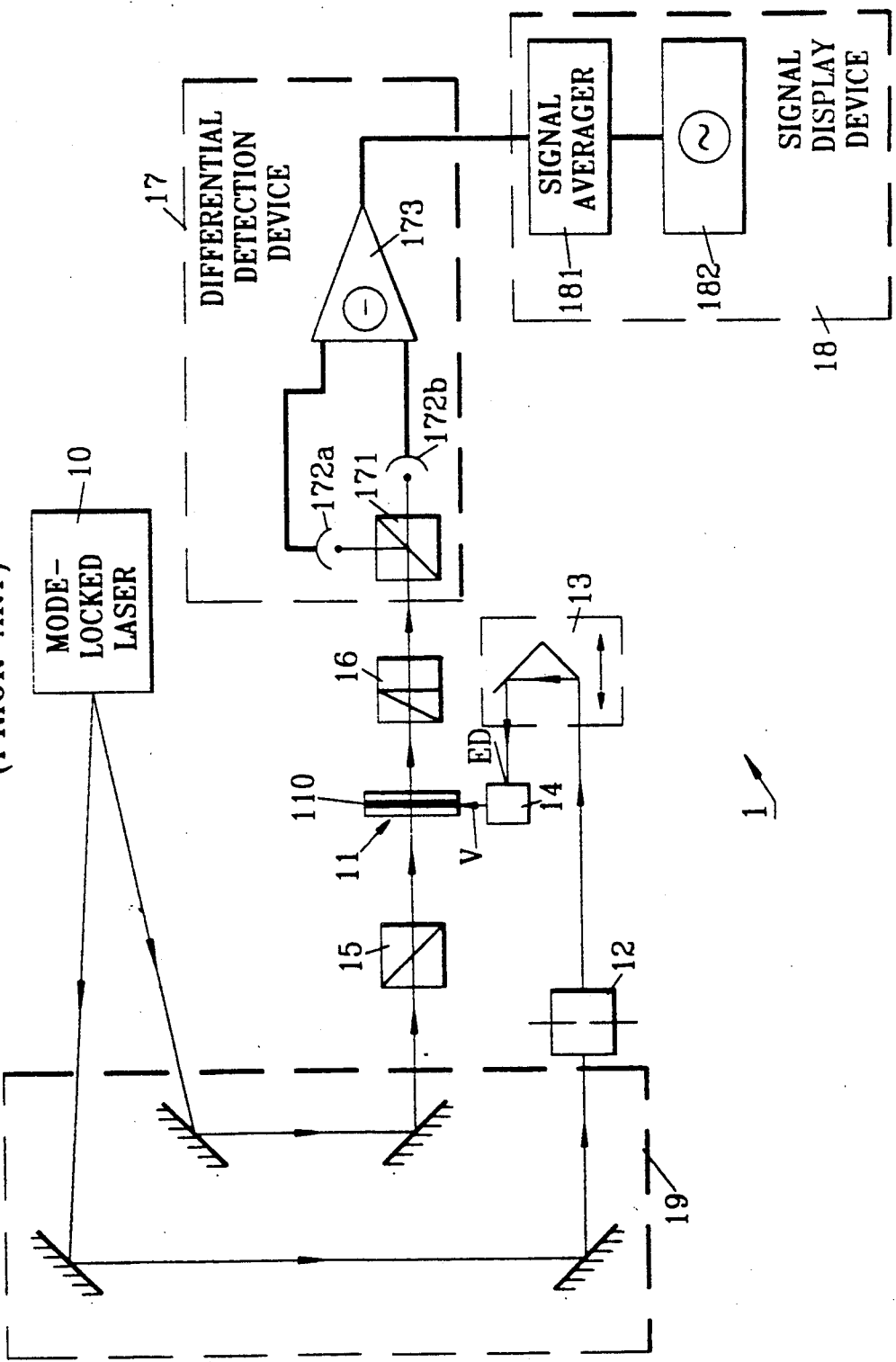
FIG. 1 shows an electrical signal measurement device using the electro-optical sampling technique embodying the prior art.

In reference to FIG. 1, an embodiment of a device 1 for measuring an electrical signal by electro-optical sampling technique essentially comprises, according to U.S. Pat. No. 4,648,819 issued Oct. 21, 1986 and International patent application No. WO 83/02829 published on Aug. 18, 1983, a laser source 10, a Pockels cell called electro-optical sampling cell 11, a light chopper 12, a controlled optical delay device 13, a polarizer 15, a quarter-wave plate type compensator 16, a differential detection device 17 and signal display device 18. The locked-mode laser source 10 generates a beam of light pulses, for example 120 femtoseconds (fs) in duration at 100 MHz rate. The beam is split into two distinct light beams following two respective axes of propagation by means of a geometrical arrangement of mirrors 19.

A first light beam is applied, via the light chopper 12 and the optical delay device 13, to a triggering input ED of a source 14 generating the electrical signal V to be analyzed and measured. Responsive to high levels of the light pulses the source 14 is triggered thereby applying the electrical signal V to be measured to an electrode 110 in the form of a metal strip fixed to a side of the Pockels cell 11. The other opposite side of the Pockels cell is metallized and brought to a ground referenced voltage. In the Pockels cell 11, the signal V produces an electric field $\vec{E}$ perpendicular to the strip electrode 110.

A second light beam is applied to a second side of the Pockels cell 11 orthogonally relative to the metallized sides via the polarizer 15 and samples in synchronism the unknown electric field $\vec{E}$ which is propagating in the cell 11. Through the Pockels effect consisting in modifying the indices of refraction of the crystal of the cell 11, the light pulses of the second light beam are modulated by the electric field propagating in the crystal. This results in a sampling of the electric field, the second light beam being composed of pulses. The modulated light beam resulting from the sampling goes through the optical compensator 16 to be applied to a side of the analyzer 171 in the differential detection device 17. The device 17 further comprises two further photodetectors 172a and 172b and a differential amplifier 173. In a known manner in modulation devices using the Pockels effect, the compensator 16 enables the modulation response of the cell 11 to be linearized.

The analyzer 171 separates the two components in quadrature of the polarized modulated light beam. These orthogonal light components are converted in the two photodetectors 172a and 172b into two currents representative of the intensities of said light components and applied at the inputs of the differential amplifier 173 respectively.

This differential device has the advantage of more sensitive measurement as well as being less sensitive to laser fluctuations.

A differential signal at output of the differential amplifier 173 is applied to an input of the signal display device 18 comprising a signal averager 181 and a display oscilloscope 182. The averager 181 smooths the differential signal which is then applied to an input of the oscilloscope 182 in order to be displayed on a screen of said oscilloscope.

In such a measurement device, the "reconstituting" of the signal to be measured is carried out by controlling the controlled optical delay device 13. By introducing a variable delay in the propagation of the pulses of the first light beam triggering the source 14, it is possible to sample the entire profile of the electric signal to be measured V, and then to display it, in this instance by means of the oscilloscope 182 in which an equivalent time in proportion to the increase of the delay introduced by the optical delay device 13 is applied on the abscissa axis, and the amplitude of the smoothed signal is applied on the ordinate axis.

The applications of the electro-optical sampling technique are not limited to the measurement of an electric signal and an incomplete list of applications would comprise, e.g.:

characterization of electrical characteristics in electronic devices, characterization of the transmission characteristics in connectors and cables, measurement of dielectric constants.

Further embodiments of the electrical signal measurement device using the electro-optical sampling technique are known in the prior art, such as those described e.g. page 427 of the book by Amnon Yarin entitled "Introduction to Optical Electronics", published by HOLT, RINEHART & WINSTON, New York, 1976. All these measurement devices are based on this sampling technique and are limited as regards their utilizations by the drawbacks mentioned in the preamble to the specification.

Figure 2:
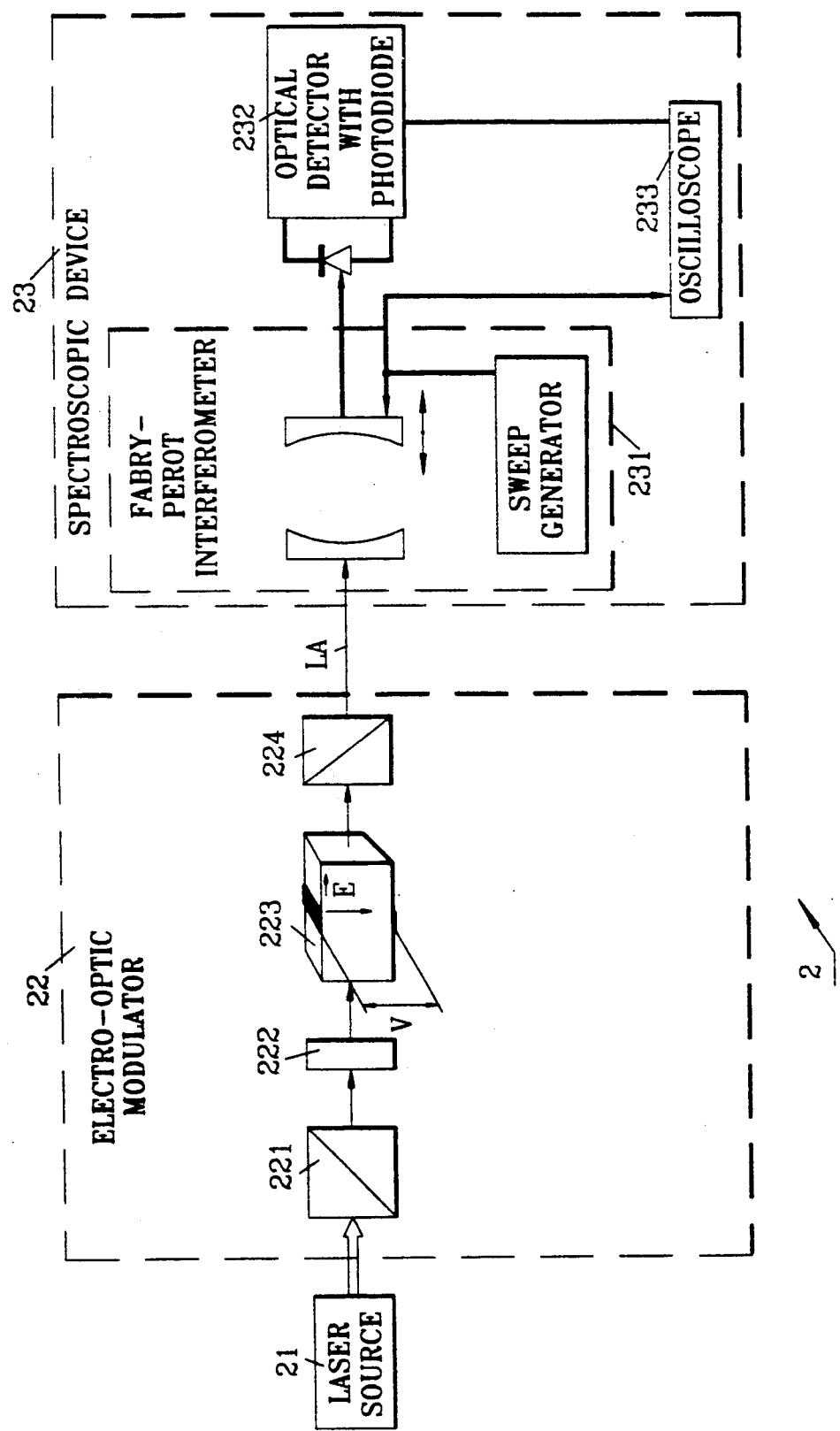
FIG. 2 shows a measurement system for frequency analysis of an electrical signal embodying the prior art.

This invention is founded not on the electro-optical sampling technique but on a frequency spectrum analysis technique already implemented in an electro-optic measurement system described in U.S Pat. No. 5,041,778 issued Aug. 20, 1991. An embodiment of the measurement system according to this U.S patent is shown in FIG. 2. It essentially comprises a laser source 21, an electro-optic modulator 22, and a spectroscopic device 23. The laser source 21 is of the monochromatic, continuous light wave type and not of the pulsed type, and has a very small line width. The laser source 21 is e.g. of the Helium-Neon (He - Ne) gas type.

The electro-optic modulator 22 is a Pockels cell comprising a polarizer 221, a compensator 222, a crystal 223 with electro-optic property, and a polarizer-analyzer 224. The polarizer 221 is e.g. comprised of a GLAN or NICOLL prism. Polarizer 221 receives the light wave emitted by the laser source 21 and supplies a rectilinearly polarized light wave. This polarized light wave is applied through the compensator 222 to a first side of the crystal 223. The compensator 222 is of the quarter-wave type and its purpose is to introduce a phase lag of $\pi/2$ in the polarized light wave so as to polarize the modulator 22 in a linear part of its frequency response curve.

The electro-optic crystal 223 is e.g. comprised of an ADP crystal (($NH_4$) $H_2 PO_4$) having, on two sides perpendicular to the side receiving the polarized light wave, two respective conductive strips between which is applied an electrical signal V to be measured. The electrical signal V produces in the crystal 223 an electric field E perpendicular to the propagation direction of the polarized light wave. The polarized light wave is amplitude-modulated into an amplitude-modulated light wave as a function of the electric signal V and transmitted by the crystal 223 to be applied to a side of the polarizer-analyzer 224 which supplies an amplitude-modulated light wave $L_A$ cross-polarized with regard to that of the light wave transmitted by the polarizer 221. Designating by $IL_A$ the intensity of the amplitude-modulated light wave $L_A$ transmitted by the polarizer-analyzer 224, the modulation is expressed by the following relation, after suitably having oriented the polarizer 221 with regard to the crystal 223:

$$IL_A = (IL_0/2) \cdot (1 + \sin(\pi \cdot V/V_\pi))$$

where $IL_0$ denotes the maximum intensity of the incident light wave produced by the laser source 21, and $V_\pi$ denotes a constant depending on the characteristics of the electro-optic crystal 223 and on the wavelength of the incident light wave.

The modulated light wave $L_A$, is applied to the spectroscopic device 23 comprising a FABRY-PEROT sweeping interferometer 231, a photodiode-equipped optical detector 232, and an oscilloscope 233. The modulated light wave is injected into a tunable cavity of the interferometer 231 which, under the control of a low-frequency sweep ramp signal generated by a sweep generator, is successively tuned to different frequencies of a frequency range to be explored. The cavity supplies corresponding frequency light components which are received by a photodiode of the optical detector 223. From a current supplied by the photodiode, the detector 223 produces a signal having an intensity proportional to the intensities of the different frequency components of the signal V to be measured. The sweep ramp signal and the intensity signal are applied at inputs of oscilloscope 232 so as to visualize the frequency spectrum on the screen of oscilloscope 232. The spectrum obtained is the spectrum of the modulated light wave $L_A$ comprising two modulation sidebands situated on either side of the "laser line" of the laser source 21. From the spectrum of the modulated light wave $L_A$ and from the emission frequency of the laser source 21 is deduced the spectrum of the signal V to be measured.

Nevertheless, such a device of FIG. 2 only provides two informations characterizing the signal to be measured V: the frequency(ies) and the corresponding amplitude(s). Phase information on the signal V cannot be deduced.

Based on the very general principle of U.S Pat. No. 5,041,778, this invention aims to extract this phase information as achieved in sampling technique devices initially commented in this specification.

Figure 3:
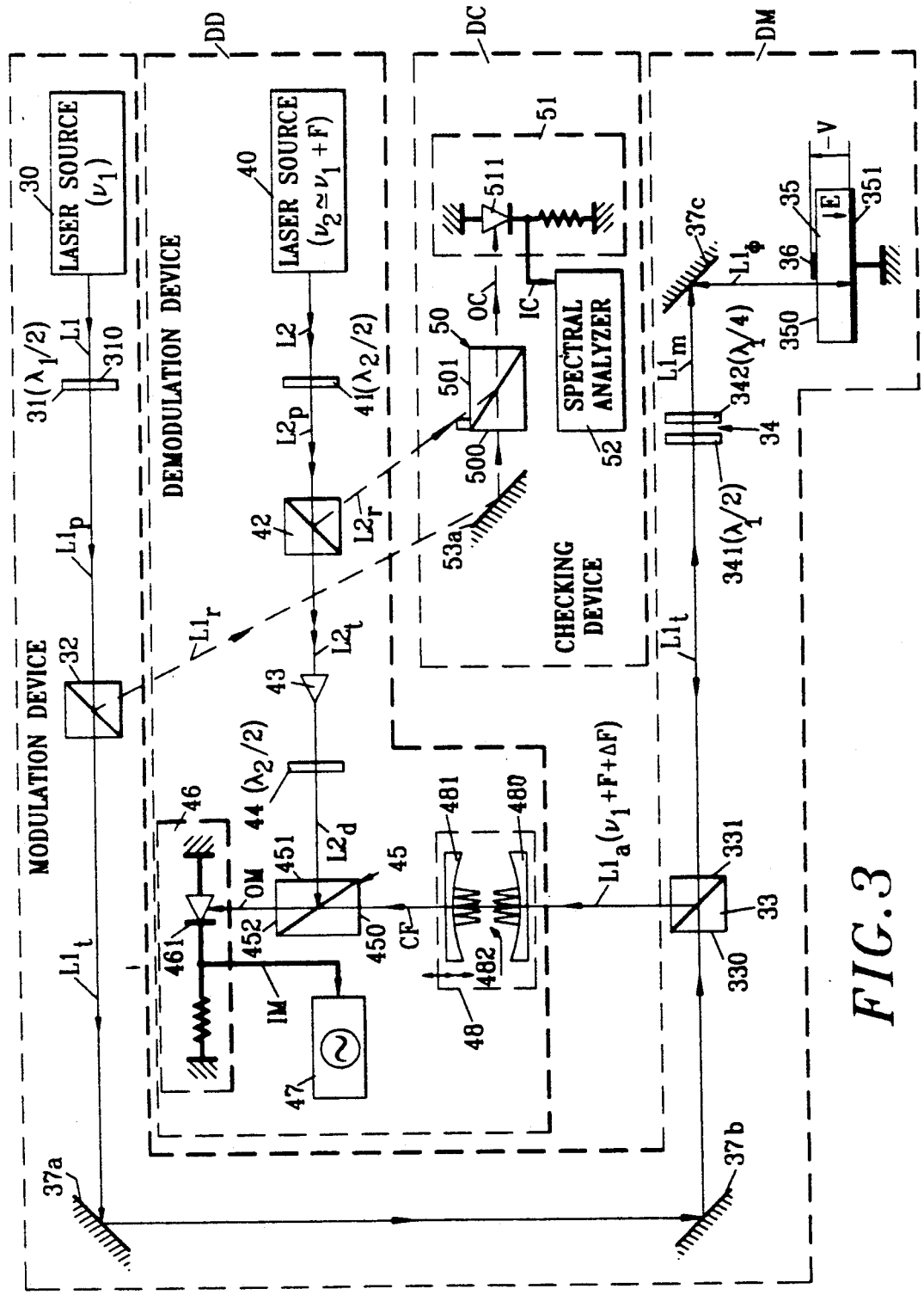
FIG. 3 shows an electrical signal measurement system by electro-optical effect embodying the invention.

In reference to FIG. 3, an electrical signal measurement system by electro-optical effect embodying the invention comprises a modulation device DM, a demodulation device DD and a checking device DC.

The modulation device DM, of "similar" type to one of the embodiments of the measurement system described in U.S Pat. No. 5,041,778, comprises, in the forward direction of a light wave emitted by a first laser source 30, successively a first directive half-wave plate 31, a first optic polarizer 32, a second optic polarizer 33, a couple of polarization plates 34, and an electro-optic crystalline substrate 35, and also a set of mirrors 37a, 37b and 37c. The demodulation device DD comprises a second laser source 40, a second directive half-wave plate 41, an optic polarizer 42, an optic isolator 43, a half-wave polarization plate 44, a beam splitter cube 45, a slow photodiode detector or photodetector 46, an oscilloscope 47 and an interferometer 48. Finally, the optical checking device DC is composed of a beam splitter cube 50, a fast photodiode photodetector 51, a spectral analyzer 52 and a mirror 53a.

It should be noted at this stage that the set of mirrors 37a, 37b and 37c in the modulation device DM, the isolator 43 in the demodulation device DD, and the mirror 53a in the checking device DC do not intervene in the measurement proper of the signal and are only providing for proper routing of the light waves in order to make the measurement system more compact. In the description hereinunder of the system embodying the invention, no mention is therefore made of the orientation modifications to the propagation axes of the different light waves resulting from reflection of any one of the mirrors 37a, 37b, 37b and 53a.

In reference to FIGS. 3, 4, 5 and 6, the operation of the measurement system embodying the invention is now described while presenting the different steps included in the measurement method embodying the invention.

The first laser source 30 in the modulation device DM is of the monochromatic, continuously-emitted wave type with a line of very small width. It can be e.g. a laser source using gas of the Helium-Neon (He - Ne) type with stabilized frequency, emitting a first monochromatic light wave L1 of wavelength $\lambda_1$ corresponding to frequency $\nu_1$ of several hundreds of terahertz and of very small line width $\Delta\nu_1$, typically below 10 kHZ.

Figure 5:
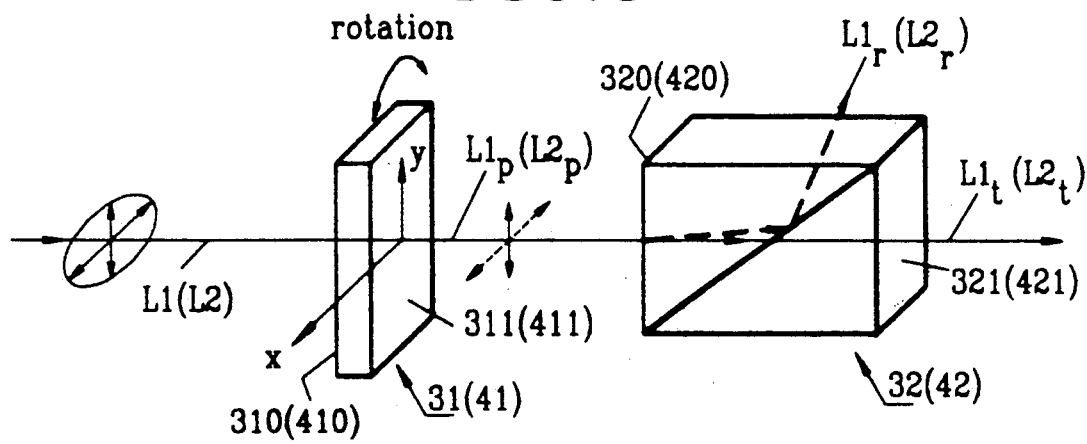
FIG. 5 shows an optical device included in the measurement system embodying the invention.

In reference to FIG. 5, the following description deals more precisely with the role played by the optical combination of the first directive half-wave plate 31 and the first polarizer 32 in the modulation device DM.

The polarizer 32 is e.g. in the form of NICOLL prisms, used as an analyzer in this instance. The light wave L1 emitted by the first laser source 30, schematically represented in circular polarization in FIG. 5, is applied, following an axis of propagation perpendicularly to one 310 of the sides of the half-wave plate 31 ($\lambda_1/2$). The plate 31 introduces a phase lag between the two orthogonal components of the emitted light wave L1. This phase lag is engendered, in a known manner for optic compensators in general, by differences in indices of refraction following predetermined axes x and y perpendicular to the axis of propagation. The plate 31 thus converts the light wave L1 produced by the first laser source 30 into a rectilinearly polarized wave $L1_p$. More precisely, by axial rotation of the half-wave plate 31 with regard to the axis of propagation of the light wave L1 so as to position the latter according to one of two predetermined positions, the light wave coming from the plate 31 is polarized according to one of two perpendicular planes. The polarizer 32 receives the polarized light wave $L1_p$ on a first side 320 and reflects or transmits said polarized wave depending on whether the latter's polarization plane, determined by one of the two positions of the half-wave plate 31, corresponds to an ordinary wave or to an extraordinary wave resulting from the birefringence properties in the polarizer 32.

Returning now to FIG. 3, as a function of the two predetermined positions of the half-wave plate 31, the polarized light wave $L1_p$ coming from the plate 31 is respectively reflected by the polarizer 32 into a reflected wave $L1_r$ towards the splitter cube 50 in the checking device DC or transmitted by the polarizer 32 into a transmitted wave $L1_t$ to the second polarizer 33 in the modulation device DM. An operator positions the half-wave plate 31 according to the two predetermined positions in order for the polarized wave $L1_p$ to be fully reflected for a measurement checking as described previously or fully transmitted for a measurement of signal V respectively. Details of the checking device DC receiving the reflected light wave $L1_r$ will be provided at a later stage after the description of the modulation device DM and demodulation device DD hereinunder.

The transmitted light wave $L1_t$ is applied perpendicularly to a first side 330 of the second polarizer 33. As the planes of main cross-section in the polarizers 32 and 33 are parallel, the light wave transmitted by a second side 331 of the polarizer 33 is identical to the transmitted light wave $L1_t$. This transmitted light wave $L1_t$ is directed to the couple of polarization plates 34. The couple of polarization plates 34 comprises a half-wave plate 341 ($\lambda_1/2$) and a quarter-wave plate 342 ($\lambda_1/4$) which are disposed parallel to one another and impose a phase lag $\Gamma_0$ between the two components of the transmitted wave $L1_t$ for optimum modulation. The transmitted wave $L1_t$ is applied perpendicularly to the sides of the two plates of the couple 34 which produces a modulation light wave $L1_m$. This phase shift $\Gamma_0$ serves to pre-polarize the modulation light wave $L1_m$ which modulates the high-frequency signal V to be measured in the linearity zone of the response of the crystalline substrate 35.

The modulation light wave $L1_m$ is oriented towards a point in the vicinity of a conductive strip 36 located on an upper side 350 of substrate 35. The electrical signal V to be measured is applied between the strip 36 and a lower side 351 of the substrate which is metallized and brought to a ground referenced voltage. The electrical signal V produces in the crystal an electric field $\vec{E}$ modifying the indices of refraction of substrate 35. The modulation wave $L1_m$ propagates in the substrate 35 as far as the other side 351 on which it is retro-reflected through the upper side 350. The light wave leaving substrate 35 via upper side 350 is thus optimally phase-modulated by Pockels effect and shapes wave $L1_\phi$. The phase lag $\Delta\phi$ introduced in the modulation light wave $L1_m$ to shape wave $L1_\phi$ is expressed by the following equality:

$$\Delta\phi = \pi V/V_{90},$$

in which $V_\pi$ is a parameter depending on the characteristics of substrate 35 and on the wavelength $\lambda_1$ of the light wave L1 emitted by the first laser source 30.

The phase-modulated retro-reflected light wave $L1_\phi$ propagates according to a backward direction as opposed to the forward direction of the modulation light wave $L1_m$, and is applied perpendicularly to the second side 331 of the second polarizer 331 via the couple of polarization plates 34. The polarization rotation induced by the electric field E on the modulation light wave $L1_m$ entails that the light wave $L1_\phi$ comprises two components in quadrature. The phase-modulated light wave $L1_{100}$ is "converted" into an amplitude-modulated light wave $L1_a$ by means of the couple of plates 34 and the polarizer 33. Precisely at the level of the diagonal cross-sectional plane in the second polarizer 33, realized in the form of NICOLL prisms, a first reflected amplitude-modulated component $L1_a$ is injected into the tunable optical cavity 482 of the interferometer 48 in the demodulation device DM via a fixed semi-transparent wall 480 while a second component is transmitted with without any propagation axis modification. In reference to FIG. 4, the light component $L1_a$ reflected by the second polarizer 33 has a spectrum comprising a line at frequency $\nu_1$ that corresponds to the frequency of the light wave emitted by the first laser source 30, and two sidebands BI and BS induced by the amplitude modulation. The sidebands BI and BS represent the frequency spectrum of the electrical signal V to be measured, to within respective frequency shifts.

Coming back to FIG. 3, a second semi-transparent wall 481 of the interferometer 48 is fitted with a piezo-electric control device and is mobile with regard to the fixed wall 480. Under the control of a periodical electrical signal imparting displacement on the mobile wall 481, the optical cavity 482 can be tuned successively at each period of the periodical signal, to different frequencies in a frequency range to be explored, and consequently can supply frequency light components CF corresponding to the light wave L1$_a$ via the mobile wall 481. The various spectral components CF at respective frequencies in the frequency range to be explored are successively applied, under the control of the mobile wall displacement electrical signal, via said mobile wall, on a first side of the splitter cube 45 used here for combining two light beams.

The second laser source 40 continuously emits a second monochromatic coherent light wave L2 with a wavelength $\lambda_2$, corresponding to a line of frequency $\nu_2$ having a width $\Delta\nu_2$ also below 10 kHz. The wave L2 crosses the second directive half-wave plate 41 ($\lambda_2/2$), then the polarizer 42 serving as an analyzer. As indicated in the description of the modulation device DM in reference to FIG. 5, the second half-wave plate 41 and the polarizer 42 in the demodulaton device DD have roles strictly identical to those of the plate 31 and polarizer 32 in the modulation device DM. In this way, by axially rotating half-wave plate 41 successively to two predetermined positions, a polarized wave L2$_p$ coming from the half-wave plate 41 is entirely reflected by the polarizer 42 into a reflected wave L2$_r$ which is applied to a second side 501 of the splitter cube 50 in the checking device DC, then entirely transmitted as a wave L2$_t$ to the polarization half-wave plate 44 disposed parallel to a second side 451 of the splitter cube 45 in the demodulation device DD. The two polarizers 32 and 42 used as analyzers preferably have a thin dielectric anti-reflecting layer on each of their respective sides so as to avoid interaction of light waves within the system and likely to reduce the measurement efficiency of the systems.

A description will now follow of the two principal steps constituting the method embodying the invention respectively when the two directive half-wave plates 31 and 41 in the modulation device DM and demodulation device DD are positioned so that the two polarized waves L1$_p$ and L2$_p$ are entirely reflected and entirely transmitted respectively.

The first step, called as checking step, embodying the invention involves the reflection of the two polarized waves L1$_p$ and L2$_p$. The reflected waves L1$_r$ and L2$_r$ are represented by broken lines in FIG. 3, and are applied to two respective perpendicular sides 500 and 501 of the splitter cube 50 in the checking device DC. The reflected wave L2$_r$ is reflected by the diagonal semi-reflecting plane in the splitter cube 50, used as a beam combiner cube, in order to be recombined with the reflected wave L1$_r$ into a checking wave OC, the reflected waves L1$_r$ and L2$_r$ being parallel polarized by means of half-wave plates 31 and 41 through the polarizers 32 and 42. The checking wave OC has a beat frequency $\nu_1-\nu_2$ equal to the difference between the emitting frequencies of the first and second laser sources 30 and 40. This checking wave OC is applied to a photodiode 511 in the fast-detection photodetector 51 for supplying an electrical signal IC representative of said checking wave OC. The electrical signal IC is applied to an input of the spectrum analyzer 52. In the spectrum analyzer 52 a means is included for sweeping a frequency range. The spectrum analyzer 50 enables a "line" to be displayed at a frequency equal to the difference between the emitting frequencies of the first and second laser sources 30 and 40.

In a second step, called as measurement step, during which the polarized waves are entirely transmitted, the light beams are represented in continuous lines in FIG. 3. The frequency components CF of the signal V to be measured, translated into the frequency range by amplitude modulation, are applied at a first side 450 of the splitter cube 45 while the second side 451 of this cube perpendicular to side 450 receives a demodulation light wave L2$_d$ derived from the transmitted light wave L2$_t$ applied to the half-wave polarization plate 44. The directive half-wave plate 44 receiving the transmitted wave L2$_t$ for producing the demodulation wave L2$_d$ is positioned by axial rotation in order for the demodulation wave L2$_d$ reflected in the splitter cube 45 to be polarized parallel with the different "filtered" frequency components CF. The demodulation wave L2$_d$ is reflected by the diagonal semi-reflecting plane in the splitter cube 45 in order to be periodically combined with one of the frequency components CF coming from the interferometer 48.

Figure 6:
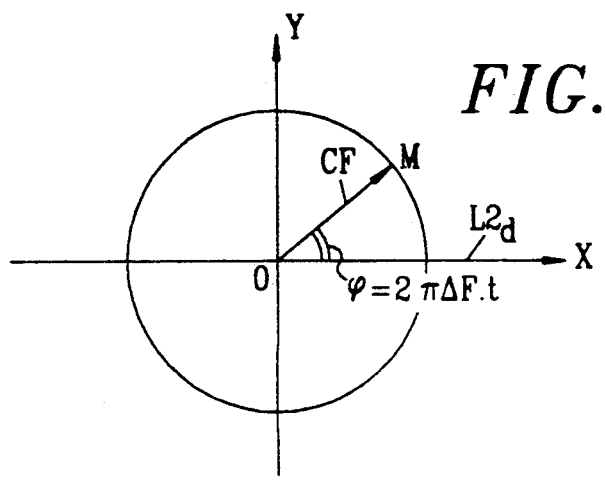
FIG. 6 is a phase diagram.

As shown schematically in the phase diagram in FIG. 6, the optical combination of a frequency component CF at a frequency f with the demodulation wave L2$_d$ at a frequency of emission $\nu_2$ from the laser source 40 produces a measurement light wave OM at frequency $\Delta F=|\nu_2-f|$. Information on the phase of the frequency component CF in relation to the phase of the demodulation wave L2$_d$ is also extracted. It is precisely the role of the slow diode photodetector 46 and of the oscilloscope 47 to extract these frequency $\Delta F$ and phase data. The measurement wave OM coming from the splitter cube 45 is applied to a photodiode 461 in photodetector 46 which supplies an output electrical signal IM representative of the frequency and phase of the measurement wave OM. The electrical signal IM is applied to the oscilloscope 47 in order to be displayed on it. In this way, an operator carrying out a measurement with the system embodying the invention adjusts the value of the electrical signal controlling the mobility of the mobile wall 481 of the interferometer 48 in order to "filter" a frequency component CF and display the phase and frequency of said frequency component in relation to those of the demodulation wave L2$_d$ on the screen of the oscilloscope 47.

According to another embodiment, the splitter cube 45 can be replaced by an optical fiber coupler.

Figure 4:
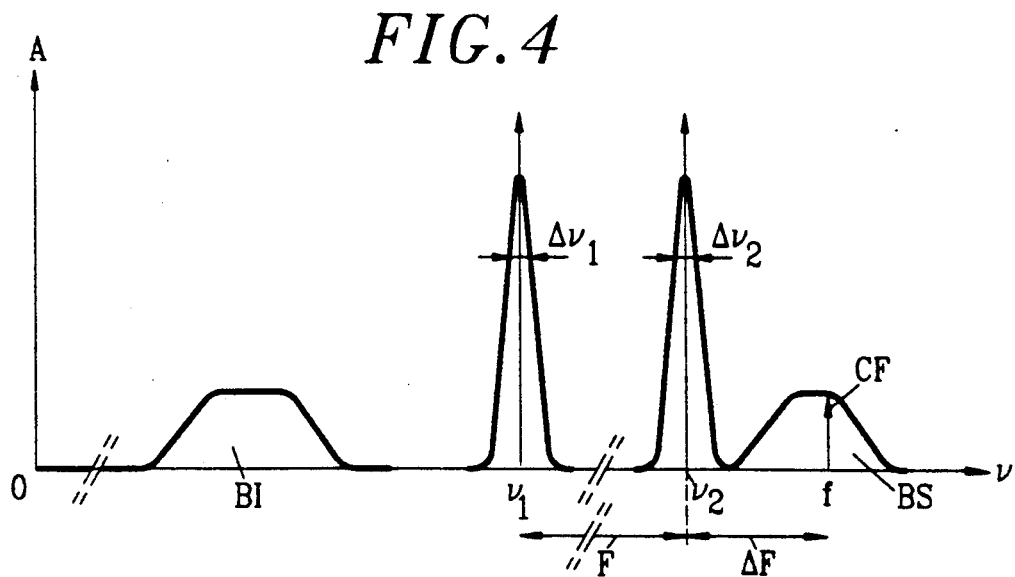
FIG. 4 is a frequency representation for the purpose of explaining the measurement principle embodying the invention.

The frequency representation corresponding to the phase diagram shown in FIG. 6 is represented in FIG. 4.

As shown in FIG. 4 in which the frequency line $\nu_2$ of the second laser source 40 is intentionally substantially superimposed on the spectrum of the first amplitude-modulated component L1$_a$, the measurement principle embodying the invention is now described. During the checking step, the frequency of emission $\nu_2$ is adjusted in the second laser source 40 in order for it to be substantially equal to one of the limits of the frequency side bands BI and BS of the first amplitude-modulated component L1$_a$. According to the embodiment illustrated in FIG. 4, the frequency $\nu_2$ is substantially equal to the lower limit of the upper sideband BS of the amplitude-modulated component L1$_a$. Then during the measurement steps, the demodulation wave L2$_d$ in the splitter cube 45 is performed with small frequency gaps $\Delta F=\nu_2-f$ between the two waves justifying the use of the slow photodetector, and enabling accurate measurement notably concerning the extracting of phase data.

In this way, the frequency, amplitude and phase of each component CF in relation to the demodulation wave L2d can be deduced.

The frequency of a frequency component CF results from addition of the frequency $F = \nu_2 - \nu_1$ of the checking wave OC and the frequency $\Delta F$ of the signal IM displayed on the oscilloscope 47. Under these conditions, for an electrical signal V to be measured having frequency components included between F and $F + \Delta F$ in the region of several tens of gigahertz, it appears that its useful band width $\Delta F$, in the region of ten gigahertz, is analyzed in the oscillator 47 subsequent to a transposition into a frequency range well below the gigahertz.

What we claim is:

1. A method for measuring a high-frequency input electrical signal (V) having a frequency bandwidth, comprising the steps of:
   (a) emitting a first rectilinearly-polarized monochromatic light wave (L1) having a first frequency;
   (b) amplitude-modulating said first light wave by said input electrical signal to produce an amplitude-modulated light wave (L1a) having two frequency sidebands (BI, BS) representative of said bandwidth of said input electrical signal;
   (c) filtering a frequency light component (CF) from said amplitude-modulated light wave;
   (d) emitting a second monochromatic light wave (L2) having a second frequency substantially different from said first frequency and rectilinearly-polarized in a direction parallel with said first light wave;
   (e) combining said first and second light waves to produce a checking wave (OC) having a beat frequency equal to the difference between said first and second frequencies;
   (f) adjusting the frequency of emission ($\nu_2$) of said second light wave to a value substantially equal to one of the limits of one of said side bands of said amplitude-modulated light wave;
   (g) combining said frequency light component of said amplitude-modulated light wave and said second light to define a measurement light wave (OM); and
   (h) detecting said measurement light wave in a frequency range substantially equal to the bandwidth of the input electrical signal to produce an output electrical signal (IM) that is representative of the frequency and phase of the measurement wave (OM), thereby to indicate the frequency components of said input electrical signal as transposed by said beat frequency.

2. A system for measuring a high-frequency input electrical signal (V) having a frequency bandwidth, comprising:
   (a) first emitting means (30) for emitting a first monochromatic light wave (L1) having a first frequency;
   (b) first polarizing means (31) for rectilinearly-polarizing said first light wave successively into first and second rectilinearly-polarized light waves having different polarizations therebetween;
   (c) means (33, 34) for amplitude-modulating said second polarized light wave by said input electrical signal to define an amplitude-modulated light wave (L1a);
   (d) frequency tunable means (48) for filtering said amplitude-modulated light wave into different frequency light components lying within said frequency bandwidth of said electrical signal;
   (e) second emitting means (40) for emitting a second monochromatic light wave (L2) having a second frequency substantially different from said first frequency;
   (f) second polarizing means (41) for rectilinearly polarizing said second monochromatic wave successively into third and fourth rectilinearly-polarized light waves having polarizations different therebetween and respectively parallel with said polarizations of said first and second polarized light waves;
   (g) first combining means (50) for combining said first and third polarized light waves to define a checking light wave (OC) when said first and second polarizing means polarize simultaneously said first and second light waves into said first and third polarized light waves;
   (h) means (52) for deriving from said checking light wave the difference between said first and second frequencies of said first and second monochromatic light waves;
   (i) second combining means (45) for combining said frequency light components and said fourth polarized wave to define a measurement light wave (OM) when said first and second polarizing means polarize simultaneously said first and second light waves into said second and fourth polarized light waves; and
   (j) means (46) for detecting said measurement light wave in a frequency range substantially equal to the bandwidth of the input electrical signal to produce an output electrical signal (IM) that is representative of the frequency and phase of the measurement light wave, thereby to indicate the frequency components of said input electrical signal as transposed by said beat frequency.

3. The system as defined in claim 2, wherein said first polarizing means comprises a polarizer (32), and an axially-rotatable half-wave plate (31) disposed between said first emitting means and said polarizer, said half-wave plate having first and second orthogonal positions for successively transmitting said first and second (L1$_t$) polarized light waves via said polarizer respectively to said first combining means and said amplitude-modulating means.

4. The system as defined in claim 2, wherein said second polarizing means comprises a polarizer (42), and a second axially-rotatable half-wave plate disposed between said second emitting means and said polarizer, said half-wave plate having first and second orthogonal positions for successively transmitting said third and fourth polarized light waves via said polarizer respectively to said first and second combining means.

5. The system as defined in claim 2, wherein said first and second combining means each comprise an optical beam splitter used as a combiner.

6. A system as defined in claim 2, and further including means for adjusting the polarization of said fourth polarized light wave in a direction parallel to the polarization of said frequency light components.

7. The system defined in claim 6, wherein said polarization adjusting means comprises an axially-rotatable half-wave plate.

8. A system as defined in claim 2, wherein said first polarizing means comprises a first axially rotatable half-wave plate and a first polarizer successively disposed along a propagation axis of said first light wave between said first emitting means and both said first combining means and amplitude-modulating means; and further wherein said second polarizing means comprises a second axially-rotatable half-wave plate and a second polarizer successively disposed along a propagation axis of said second light wave between said second emitting means and both said first and second combining means, said first and second half-wave plates having a first position for simultaneously transmitting said first and third polarized light waves through said first and second polarizers to said first combining means respectively, and said first and second half-wave plates having a second position perpendicular to said first position for simultaneously transmitting said second and fourth polarized light waves through said first and second polarizers to said amplitude-modulating means and said second combining means respectively.

9. A system as defined in claim 8, and further including means disposed between said second polarizer and said second combining means for adjusting the polarization of said fourth polarized light in a direction parallel with the polarization of said frequency light components.

* * * * *